(12) United States Patent
Pan

(10) Patent No.: US 7,286,417 B2
(45) Date of Patent: Oct. 23, 2007

(54) LOW POWER DISSIPATION VOLTAGE GENERATOR

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 112 days.

(21) Appl. No.: 11/157,648

(22) Filed: Jun. 21, 2005

(65) Prior Publication Data

US 2006/0285401 A1    Dec. 21, 2006

(51) Int. Cl.
*G11C 5/14* (2006.01)
(52) U.S. Cl. .......................... 365/189.09; 365/189.11; 365/226
(58) Field of Classification Search ........... 365/189.09, 365/189.11, 226, 227, 230.06; 327/534, 327/536, 537
See application file for complete search history.

(56) References Cited

U.S. PATENT DOCUMENTS

| | | | |
|---|---|---|---|
| 4,916,334 A | 4/1990 | Minagawa et al. | |
| 4,922,458 A | 5/1990 | Watanabe et al. | |
| 4,951,259 A | 8/1990 | Sato et al. | |
| 5,058,063 A | 10/1991 | Wada et al. | |
| 5,398,047 A | 3/1995 | Nara et al. | |
| 5,406,517 A | 4/1995 | Chang et al. | |
| 5,490,119 A | 2/1996 | Sakurai et al. | |
| 5,612,924 A | 3/1997 | Miyamoto | |
| 5,615,164 A | 3/1997 | Kirihata et al. | |
| 5,621,691 A | 4/1997 | Park | |
| 6,044,020 A | 3/2000 | Chung et al. | |
| 6,208,124 B1 * | 3/2001 | Fuchigami et al. | 323/281 |
| 6,370,063 B2 | 4/2002 | Kim | |
| 6,370,069 B2 | 4/2002 | Brass et al. | |
| 6,472,862 B1 | 10/2002 | Morgan | |
| 6,531,900 B2 | 3/2003 | Hardee | |
| 6,545,930 B2 | 4/2003 | Fischer et al. | |
| 6,549,474 B2 | 4/2003 | Liu | |
| 6,567,028 B2 | 5/2003 | Huang et al. | |
| 6,600,439 B1 | 7/2003 | Pahr | |
| 6,628,564 B1 | 9/2003 | Takita et al. | |
| 6,654,296 B2 * | 11/2003 | Jang et al. | 365/189.09 |
| 6,657,904 B2 | 12/2003 | Higuchi | |
| 6,686,747 B2 | 2/2004 | Morgan | |
| 6,687,165 B1 | 2/2004 | Cioaca | |
| 6,696,867 B2 | 2/2004 | Keeth et al. | |
| 6,700,426 B2 | 3/2004 | Brox et al. | |
| 6,700,824 B2 | 3/2004 | Van De Graaff et al. | |
| 6,738,298 B1 | 5/2004 | Cioaca et al. | |
| 6,750,695 B2 | 6/2004 | Blodgett et al. | |
| 6,765,376 B2 | 7/2004 | Chevallier et al. | |
| 6,774,673 B2 | 8/2004 | Tsuboi et al. | |
| 6,795,343 B2 | 9/2004 | Marotta et al. | |
| 6,806,691 B2 | 10/2004 | Butler et al. | |
| 6,809,968 B2 | 10/2004 | Marr et al. | |
| 6,809,970 B2 | 10/2004 | Mazumder et al. | |
| 6,809,986 B2 | 10/2004 | Kim et al. | |

(Continued)

*Primary Examiner*—Gene N. Auduong
(74) *Attorney, Agent, or Firm*—Schwegman, Lundberg & Woessner, P.A.

(57) ABSTRACT

A voltage generator circuit is described for providing a regulated voltage, such as a negative word line voltage in a semiconductor memory. The generator uses a source transistor to couple a substrate voltage, Vbb, to an output voltage node. The transistor is selectively activated by a current mirror circuit and using reference voltages. The reference voltages can be provided using a resistor divider circuit. Hysteresis is provided to maintain the output voltage in a predetermined voltage range.

22 Claims, 9 Drawing Sheets

U.S. PATENT DOCUMENTS

| | | |
|---|---|---|
| 6,842,385 B2 | 1/2005 | Cioaca et al. |
| 6,861,829 B2 | 3/2005 | Schreck |
| 6,898,144 B2 | 5/2005 | Stubbs et al. |
| 6,906,965 B2 | 6/2005 | Cioaca |
| 6,930,622 B2 | 8/2005 | Brede |
| 6,930,927 B2 | 8/2005 | Pascucci |
| 6,944,059 B2 | 9/2005 | Macerola |
| 6,946,846 B2 | 9/2005 | Corr |
| 6,958,519 B2 | 10/2005 | Gonzalez et al. |

\* cited by examiner

LOW POWER DISSIPATION VOLTAGE GENERATOR

FIELD OF THE INVENTION

The present invention relates to voltage generators and, more particularly, to a voltage generator circuit for use in a memory device.

BACKGROUND

Integrated circuits often include internal voltage generation circuitry to provide internal voltages. In a DRAM memory device, for example, a word line precharge voltage is used during memory access operations. This voltage is often generated using an internal voltage generator circuit. In addition, a substrate voltage, VBB, can be provided by a voltage pump circuit to generate a substrate bias negative voltage.

In a DRAM device, VBB pumps are traditionally turned off during a memory cell self-refresh operation, or device power-down since there is no current demand for VBB. However, in some new memory devices a word line voltage generator provides a negative voltage (for example about –0.3 V) using the VBB pump. As such, VBB current is consumed during a memory cell self-refresh operation. As shown in FIG. 1 a prior art word line voltage generator includes an inverting amplifier 100 to generate a word line reference voltage (Vnw1) of about –0.3V. Several unit gain power amplifier stages 110 are provided for different circuits distributed in the memory device. In a self-refresh operation or power down condition, the inverting amplifier and at least one unit gain amplifier are enabled. These two amplifiers can consume an undesired amount of current.

What is needed is an improved voltage generator circuit that can provide a negative voltage from VBB for using in integrated circuits, such as memory devices.

SUMMARY

In one embodiment, a voltage generator circuit comprises a source transistor coupled between a negative voltage source and an output node. The source transistor is selectively activated to couple the output node to the negative voltage source to regulate an output voltage. A reference voltage circuit provides first and second reference voltages, where the first reference voltage Vref1 is less than the second reference voltage Vref2. A control circuit is coupled to control a gate voltage of the source transistor to maintain the output voltage at approximately Vref1–Vref2.

In another embodiment, a method of generating a negative word line voltage comprises providing first, second and third reference voltages, Vref1, Vref2 and Vref3, respectively, wherein Vref3 is greater than Vref2 which is greater than Vref1. A potential voltage of the negative word line voltage is monitored, and a switch coupled between a negative source voltage and a word line voltage node is selectively activated in response to the monitoring. The negative word line voltage is regulated between about Vref1–Vref2 and Vref1–Vref3.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

Embodiments of the present description may be implemented not only within a physical circuit but also within machine-readable media. For example, the circuits and designs discussed herein may be stored upon and/or embedded within machine-readable media associated with a design tool used for designing semiconductor devices. Machine-readable media also include media having layout information such as a GDS-II file. Furthermore, netlist files or other machine-readable media for semiconductor design may be used in a simulation environment to perform the methods of the teachings described herein.

The following detailed description is, therefore, not to be taken in a limiting sense, and the scope of the present invention is defined only by the appended claims, along with the full scope of equivalents to which such claims are entitled.

Embodiments of the present invention can include a semiconductor memory device having an array of memory cells. The memory cells can be volatile or non-volatile. For example, a DRAM typically implements charge storage cells, such as trench or container capacitors. Non-volatile memory cells can be charge trapping cells such as floating gate transistors or NROM cells, phase-change memory cells such as chalcogenide cells, programmable conductor random access memory (PCRAM), latching cells such as SRAM, magnetic random access memories (MRAM's), or one-time programmable cells such as ROM cells. In addition, the memory cells can store one or more bits per cell.

Figure 1:
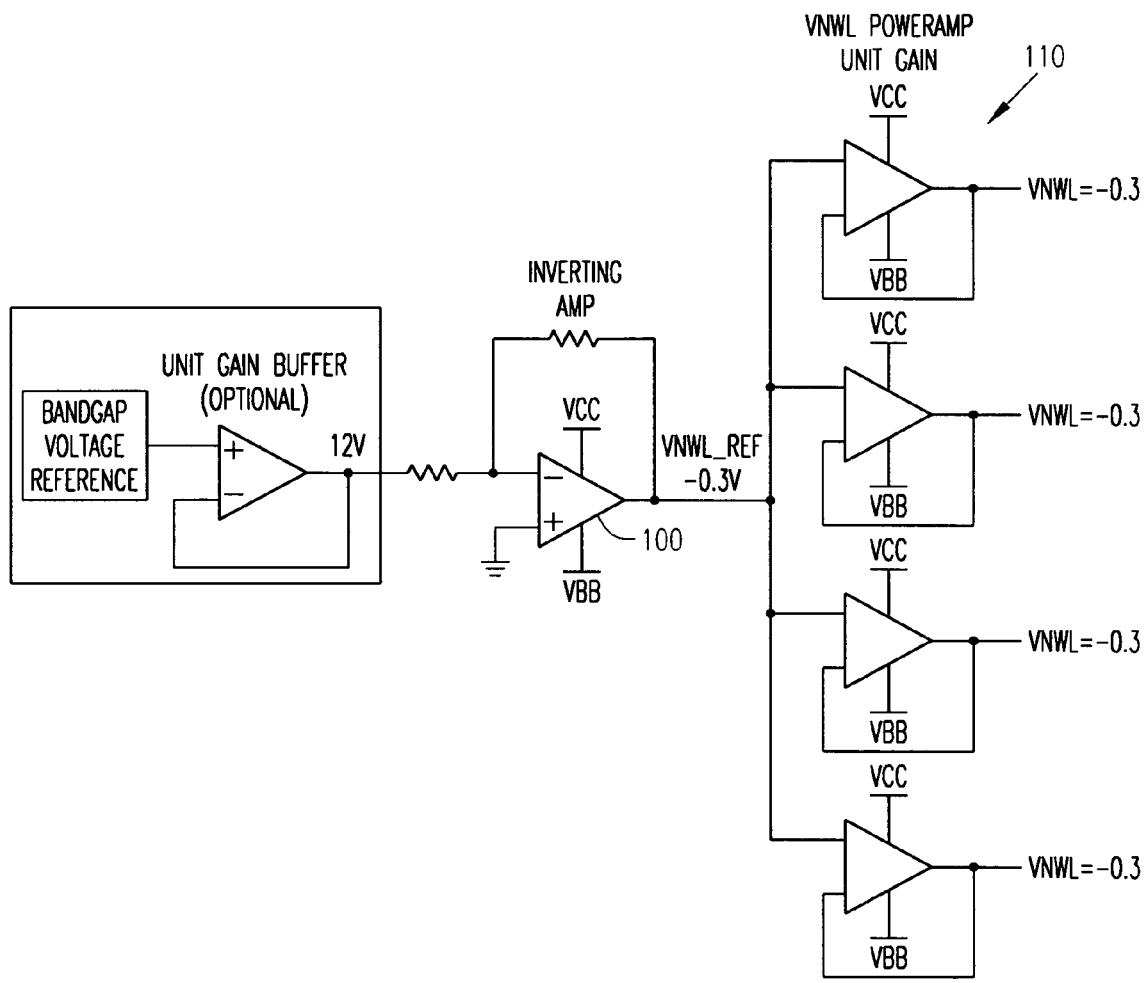
FIG. 1 is a prior art voltage generator circuit used in an integrated circuit.
Figure 2A:
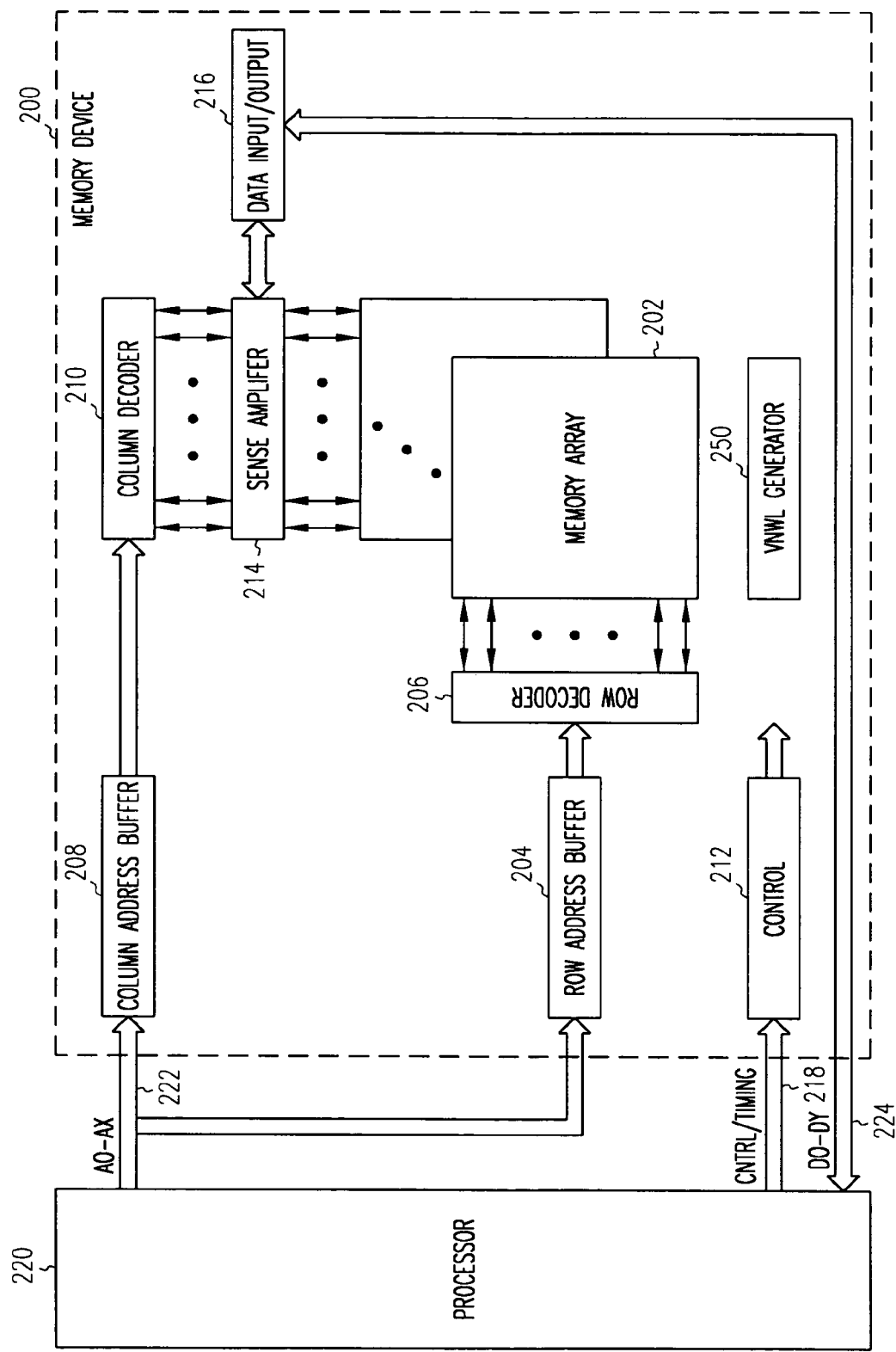
FIG. 2A is a block diagram of a memory device according to one embodiment of the invention.

FIG. 2A is a simplified block diagram of an integrated circuit dynamic memory device 200 in accordance with an embodiment of the invention. The memory device 200 includes an array of DRAM memory cells 202, row address buffer 204, row address decoder 206, column address buffer 208, column decoder 210, control circuitry 212, sense amplifiers 214 and Input/Output (I/O) circuitry 216. For a DRAM memory device, the memory array 202 contains memory cells having an access transistor coupled between a bit line and a capacitor.

The memory device 200 can be coupled to a processor 220 or other memory controller for accessing the memory array 202. The memory device 200 coupled to a processor 220 forms part of an electronic system. Some examples of electronic systems include personal computers, peripheral devices, wireless devices, digital cameras, personal digital assistants (PDA's) and audio recorders.

The memory device 200 receives control signals across control lines 218 from the processor 220 to control access to the memory array 202. Access to the memory array 202 is directed to one or more target memory cells in response to address signals received across address lines 222. Once accessed in response to the control signals and the address signals, data is written to or read from the memory cells across data, DQ, lines 224.

The memory array is arranged in rows having conductive paths used to access data stored in the memory cells. These conductive paths are referred to as word lines. During memory access operations a word line voltage is coupled to the word lines via a voltage generator circuit 250. Embodiments of the present invention use a negative word line voltage, for example a −0.3 volt potential. The voltage generator circuitry provides a regulated word line voltage from a reference voltage.

It will be appreciated by those skilled in the art that additional circuitry and control signals can be provided, and that the memory device of FIG. 2A has been simplified to help focus on the invention. It will be understood that the above description of a memory device is intended to provide a general understanding of the memory and is not a complete description of all the elements and features of a typical memory device.

Figure 2B:
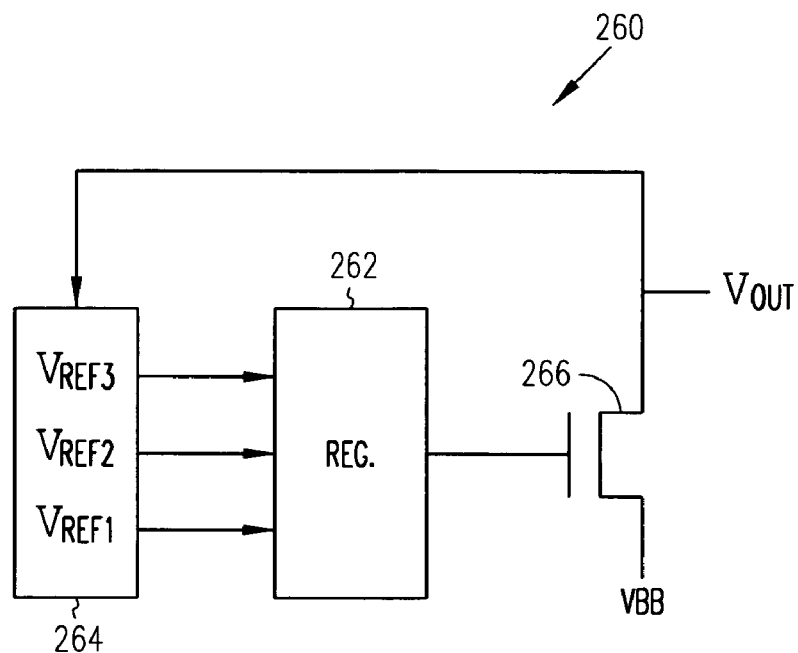
FIG. 2B is a block diagram of a voltage generator according to one embodiment of the invention.

FIG. 2B is a block diagram of a voltage generator of an embodiment of the invention. The voltage generator 260 includes a regulator circuit 262 and a reference circuit 264. The reference circuit provides a first reference voltage, Vref1, and a second reference voltage, Vref2. Vref2 is greater than Vref1. Using these reference voltages the regulator circuit controls a source transistor 266. The source transistor is coupled to the device substrate bias voltage, VBB. The output voltage, Vout, is regulated by selectively activating the source transistor. As such, Vout is maintained at about Vref1–Vref2. The Vout level is used as a feedback to the reference circuit to provide a third reference voltage, Vref3, which is greater than Vref2. In one embodiment, Vref3 is a modified Vref2. With the hysteresis, the output Vout is regulated between about Vref1–Vref2 and Vref1–Vref3.

Figure 2C:
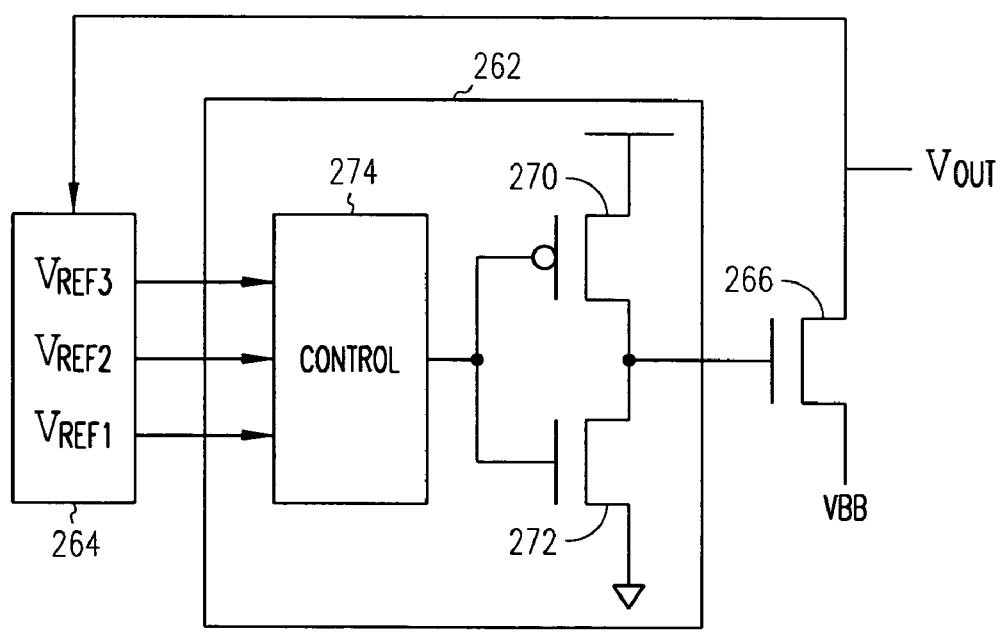
FIG. 2C is a more detailed block diagram of a voltage generator according to one embodiment of the invention.

FIG. 2C is a block diagram of a voltage generator of an embodiment of the invention. Similar to FIG. 2B, the voltage generator 260 includes a regulator circuit 262 and a reference circuit 264. The regulator includes a pull-up transistor 270, a pull-down transistor 272 and a control circuit 274. In operation, the control circuit used the reference voltages to activate either transistor 270 or 272. Thus, the source transistor 266 is controlled to provide Vout.

Figure 3:
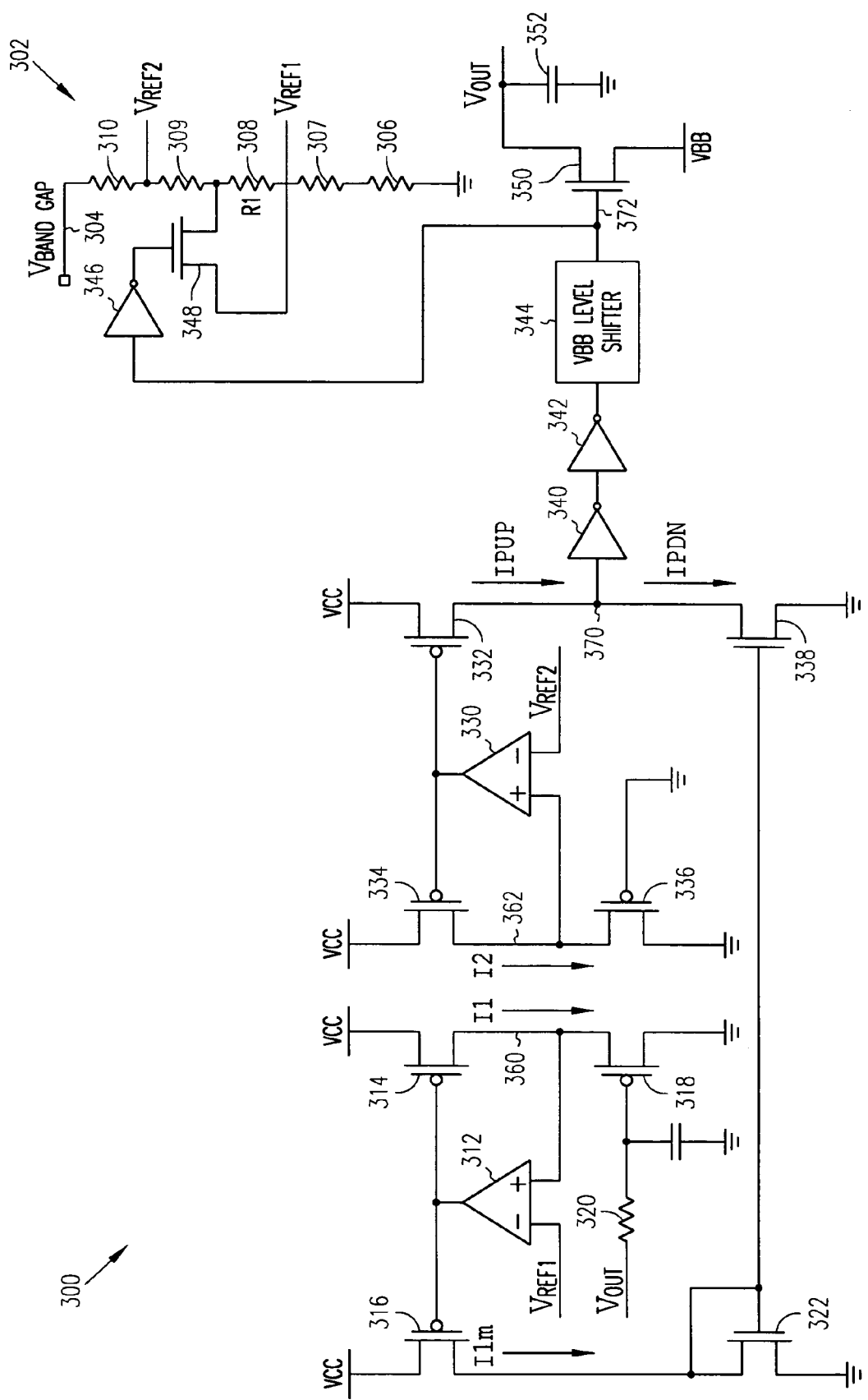
FIG. 3 is a schematic diagram of an embodiment of a voltage generator circuit of the invention.

Referring to FIG. 3 a word line voltage generator 300 of one embodiment of the invention is described. The generator uses two reference voltages from a resistor divider circuit 302. The resistor divider is coupled to a regulated reference voltage 304, for example a 1.2 volt bandgap voltage. The number and size of the resistor divider can be changed in different embodiments, but in the illustrated embodiment the resistor divider includes resistors 302–310. One or more of the resistors in the stack can be bypassed, as explained below, to change one of the reference voltages during operation. The resistor stack generates a first reference voltage Vref1 and a second reference voltage Vref2 from the regulated reference voltage. In one embodiment Vref1 is about 0.6V and Vref2 is about 0.9V.

The generator includes differential amplifier circuits coupled in a current mirror arrangement. First differential amplifier 312 has a negative input node coupled to Vref1 and an output coupled to the gates of p-channel transistors 314 and 316. Transistor 314 is coupled in series with p-channel transistor 318. A gate of transistor 318 is coupled to the output word line voltage, Vout via resistor 320. In one embodiment, the word line voltage is about −0.3 volts. Transistor 316 is coupled in series with n-channel diode coupled transistor 322. Transistors 314, 316, 318 and 322 operate as a current mirror to control a current through transistor 322.

Second differential amplifier 330 has a negative input node coupled to Vref2 and an output coupled to the gates of p-channel transistors 332 and 334. Transistor 334 is coupled in series with p-channel transistor 336. A gate of transistor 336 is coupled to ground. Transistor 332 is coupled in series with n-channel transistor 338.

The generator is best understood by describing an example operation. Transistor 318 converts the word line voltage Vout at its gate to current I1. Likewise, transistor 336 generates current I2. Differential amplifiers 312 and 330 dynamically bias transistors 318 and 336. That is, amplifier 312 forces a voltage on node 360, Vn1, equal with Vref1 and amplifier 330 forces a voltage on node 362, Vn2, equal with Vref2.

For transistor 318, the gate-source voltage is:

|Vgs|=Vn1−Vout=Vref1−Vout=about 0.9V, assuming Vref1=0.6 and Vout=−0.3;

and the drain-source voltage is: |Vds|=Vn1−0=0.6V. Since |Vds|>|Vgs|−|Vth| (threshold voltage of about 0.7V), transistor 318 is operating in its saturation region with the word line voltage operating at −0.3 volts. The current through transistor 318 is $I1=\frac{1}{2}*Kp*W/L*(Vgs-|Vth|)^2$.

For transistor 336, the gate-source voltage is:

|Vgs|=Vn2−0=Vref2−0=0.9V, assuming Vref2=0.9;

and the drain-source voltage is: |Vds|=Vn2−0=0.9V. Since |Vds|>|Vgs |−|Vth| transistor 336 is also operating in the saturation region. The current through transistor 336 is $I2=\frac{1}{2}*Kp*W/L*(Vgs-|Vth|)^2$.

Because the generator circuit 300 is coupled as a current mirror, currents through transistors 318, 322 and 338 are equal, or I1=I1m=IPDN. Further the current through transistors 336 and 332 are equal, or I2=IPUP. As such, the voltage at node 370 between pull-up transistor 332 and pull-down transistor 338 remain close to ground potential when I1>I2 and the voltage at node 370 is close to VCC when I2>I1.

Node 370 is coupled through inverters 340 and 342 and an optional level shifter circuit 344 to provide a gate voltage for source transistor 350 on word line voltage node. Transistor 350 couples the word line voltage node to VBB. It will be appreciated that VBB is an output of a negative voltage pump circuit (not shown) provided in the memory device and not described herein. The capacitive load on the word line voltage node is represented by load capacitor 352. In operation, the transistor is selectively activated to maintain a word line voltage near its desired level, in this example −0.3 volts.

The voltage on node 372 is generated by node 370 through inverters 340 and 342 and level shifter 344. As noted above, the node voltage 370 is around VCC when the word line voltage Vout is greater than its desired level of −0.3V. As such, transistor 350 is activated and pulls the word line voltage node Vout more negative until it is below −0.3V. With Vout dropping below −0.3V, the current through transistor 318 is increased to increase the current through transistor 338. As a result, the word line voltage Vout is regulated near its desired level of Vref1–Vref2, or –0.3V.

It is noted that the voltage at node 372 is also coupled to inverter 346 and transistor 348, which is coupled to the resistor divider 302. Resistor 308 is shorted when the voltage at node 372 is about zero, 0. This feature provides some hysteresis for the word line voltage, Vout. In one embodiment, the value of resistor 308 is a relatively small resistance. For example, the resistor can be selected to provide a hysteresis around 10 mV. When resistor 308 is not shorted, Vref2 increases to a higher value Vref3. This higher voltage establishes the lower threshold for Vout. That is, Vout is regulated in the range of about Vref1–Vref2 to about Vref1–Vref3. When Vout is above Vref1–Vref2, source transistor 350 is activated to pull Vout toward VBB. When Vout reaches about Vref1–Vref3, transistor 350 is turned off. The word line load 352 begins to draw from Vout and pulls Vout higher. In one embodiment with Vref1=0.6V, Vref2=0.9V and Vref3=0.91V, the output Vout is regulated between about –0.3 and –0.31V. It will be appreciated by those in the art that exact voltage levels can change with process, temperature and supply voltage conditions.

Figure 4:
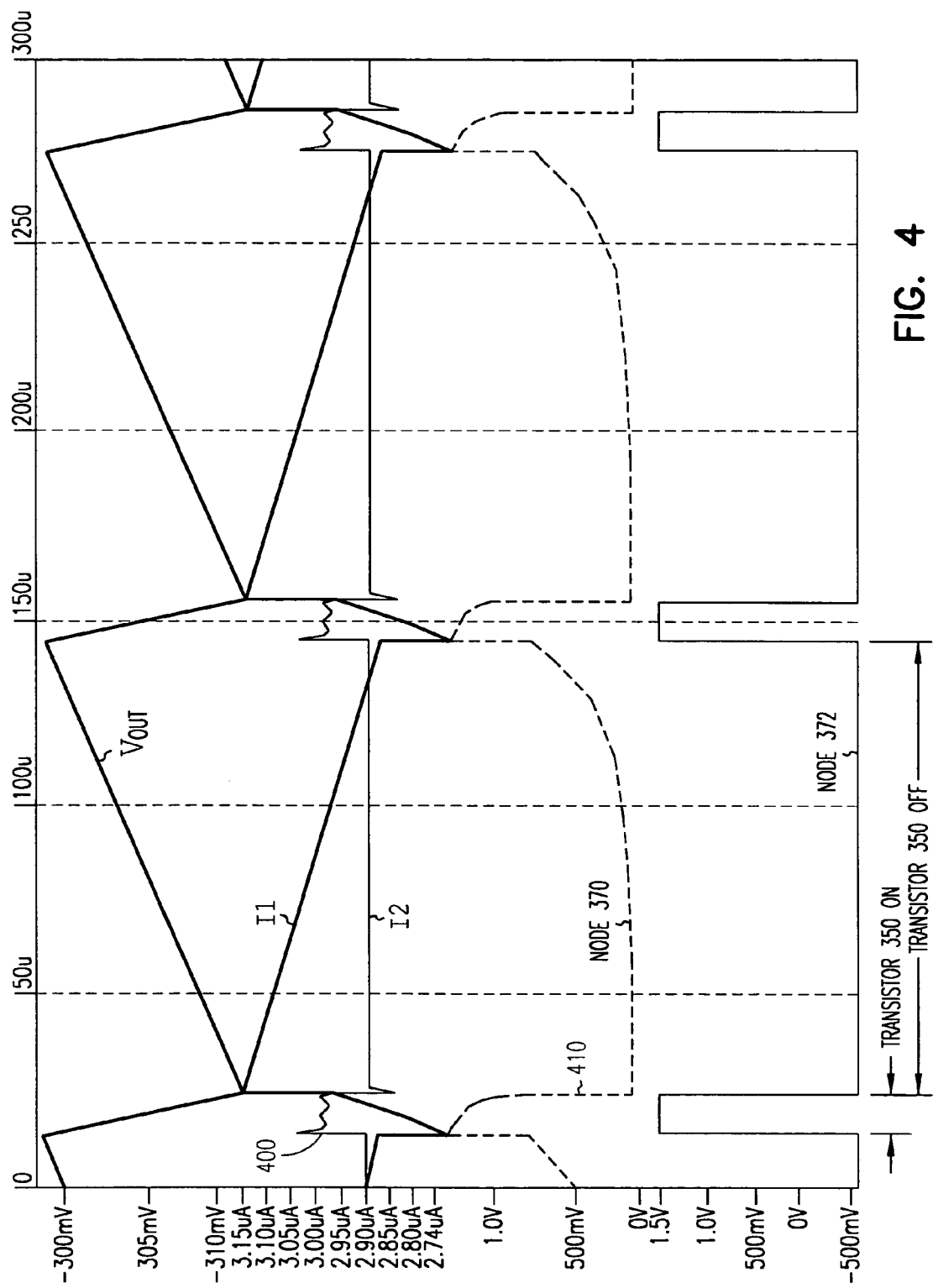
FIG. 4 illustrates simulated waveforms of the circuit of FIG. 3.

Referring to FIG. 4, a simulation of the circuit of FIG. 3 is provided. The word line voltage Vout is illustrated with a 100 uA load. The word line voltage remains around –0.3V with about a 10 mV hysteresis. The current I1 through transistor 318 is generated by the word line voltage, Vout, and varies when Vout changes. The current I2 through transistor 336, however, remains relatively constant as Vout changes. This current changes when the hysteresis resistor 308 is bypassed, at 400. The voltage at node 370 changes when currents I1 and I2 cross (at 410) and further turn on/off source transistor 350.

Figure 5:
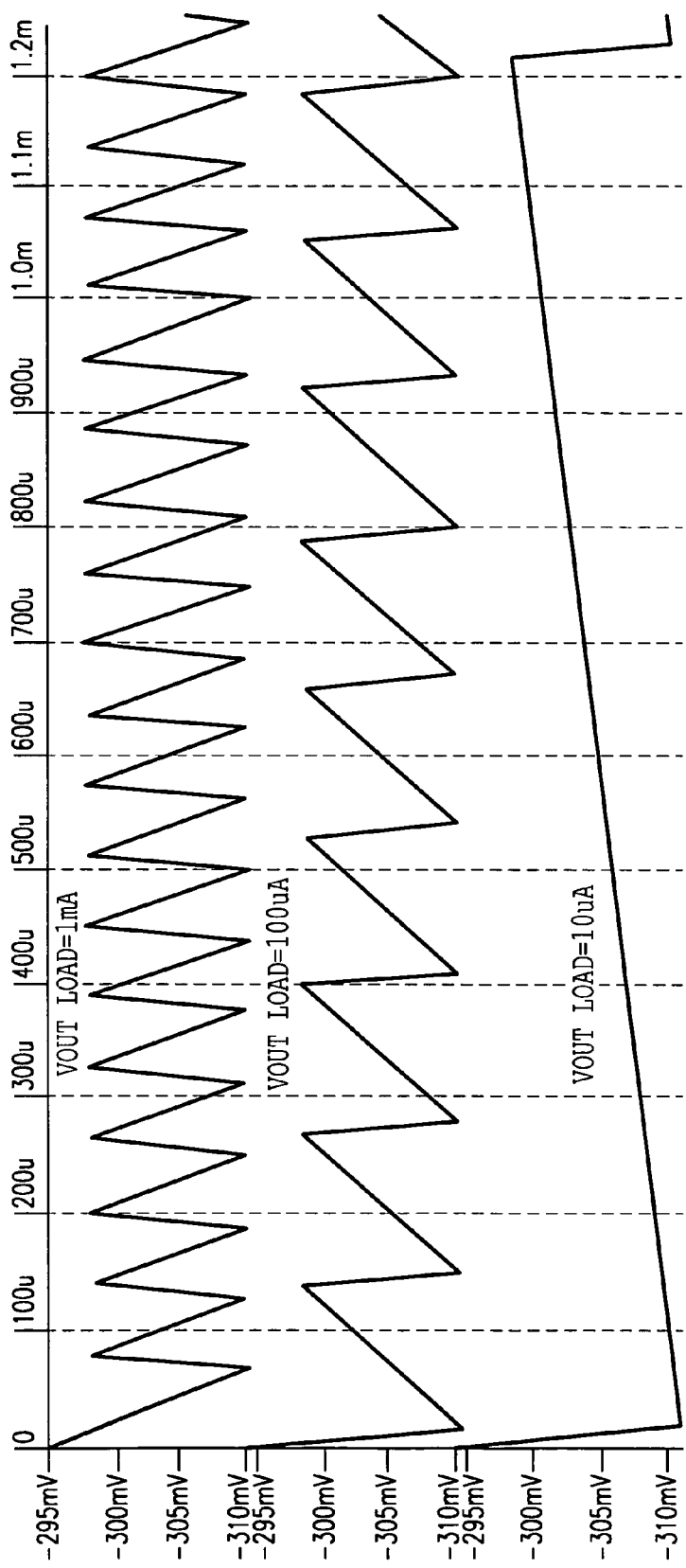
FIG. 5 illustrates simulated waveforms of the circuit of FIG. 3 for different loads.

FIG. 5 illustrates simulated word line voltages of the circuit of FIG. 3 for loads of 1 mA, 100 uA and 10 uA. Note that the average word line voltage and hysteresis are the same for different load conditions. The ramp times as well as the activation of transistor are different for different load conditions.

Figure 6A:
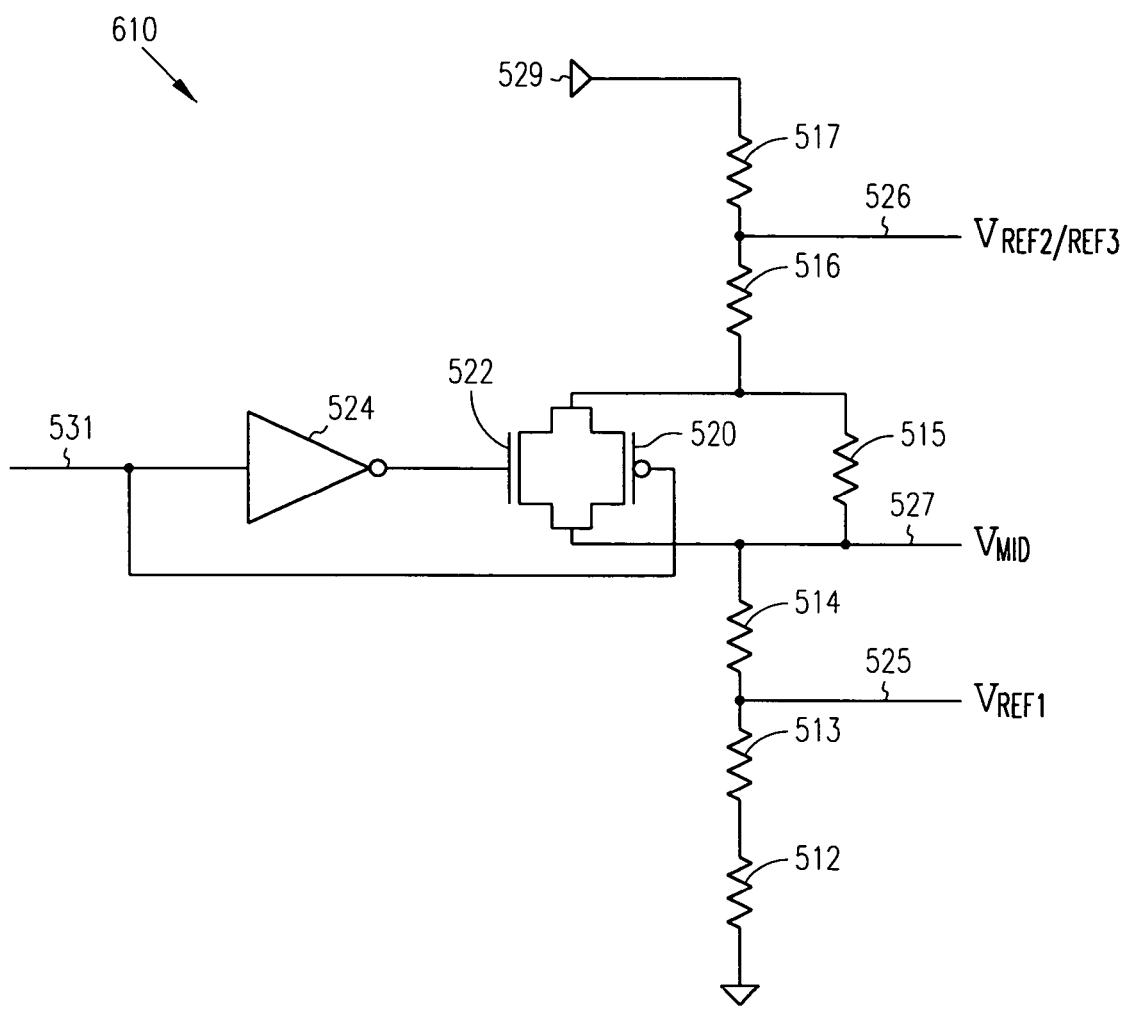
FIGS. 6A, 6B and 6C are schematic diagrams of another embodiment of a voltage generator circuit of the invention.

An alternate embodiment is described with reference to the detailed schematic diagram of FIGS. 6A to 6C. A resistor divider circuit 610 is illustrated in FIG. 6A. The divider circuit includes six series coupled resistors 512–517. Resistor 515 is selectively bypassed by PMOS transistor 520 and NMOS transistor 522. Inverter circuit 524 is coupled to the gate connections of transistors 520 and 522. The inverter is controlled by a signal on node 531, as explained below. Voltage taps are provided at node 525 between resistors 513 and 514, and node 526 between resistors 516 and 517. A third tap 527 is provided between resistors 514 and 515. The resistance of each resistor and the bandgap voltage is selected in one embodiment to provide a nominal voltage at node 525 of 0.6V and a nominal voltage at node 526 of 0.9V. For example, with a bandgap voltage of 1.2V at node 529, resistors 512–517 are respectively sized as 100 k, 100 k, 40 k, 5 k, 45 k and 100 k ohms. When resistor 515 is bypassed, node 526 provides Vref2, and when resistor 515 is not bypassed, node 526 provides Vref3.

Figure 6B:
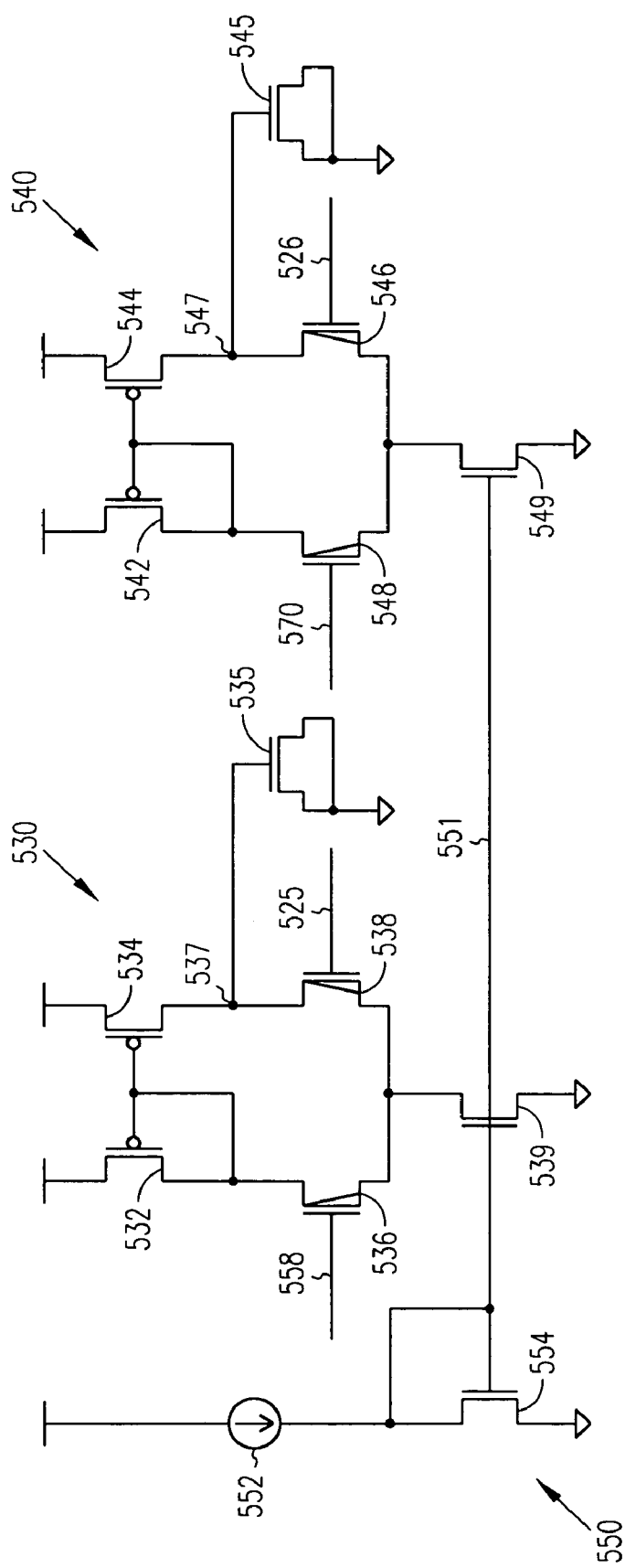

Referring to FIG. 6B, embodiments of differential amplifier circuits 530 and 540 are described. Amplifier 530 includes PMOS transistors 532 and 534 and NMOS transistors 536, 538 and 539. The gate of transistor 538 is coupled to node 525 of the resistor divider circuit 510. The gate of transistor 539 is coupled to bias circuit 550 including current source 552 and NMOS transistor 554. A capacitor 535 is coupled to node 537. In an embodiment, the capacitor can be configured from a NMOS transistor with its source and drain connected together.

Amplifier 540 includes PMOS transistors 542 and 544 and NMOS transistors 546, 548 and 549. The gate of transistor 546 is coupled to node 526 of the resistor divider circuit 510. The gate of transistor 549 is coupled to bias circuit 550. Capacitor 545 is coupled to node 547. In an embodiment, the capacitor can be configured from a NMOS transistor with its source and drain connected together.

Figure 6C:
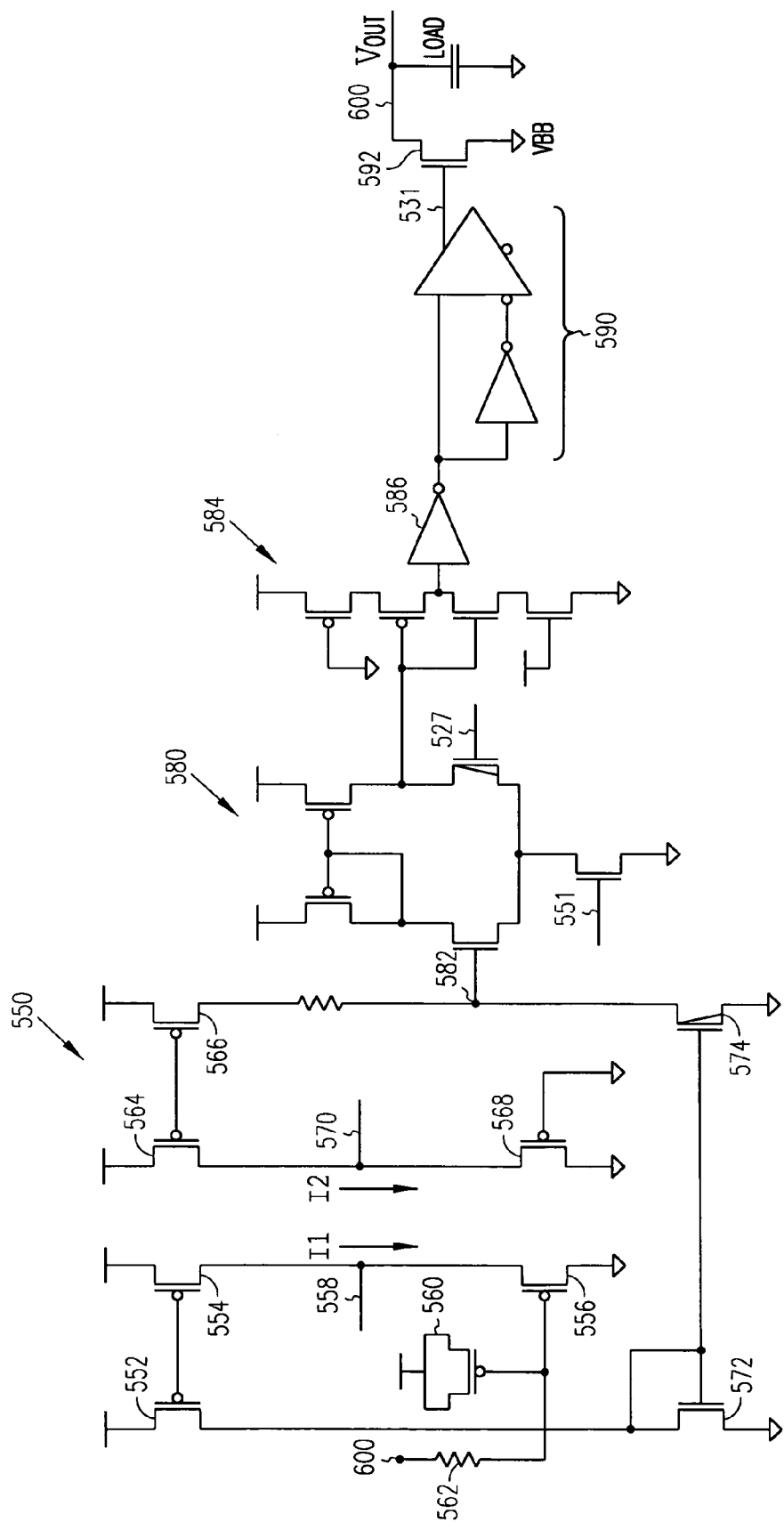

FIG. 6C illustrates a current mirror 550 of one embodiment of the invention. One side of the current mirror includes PMOS transistors 552, 554 and 556. Node 558 is coupled to the gate of transistor 536 of amplifier 540 (FIG. 6B). The gate of transistor 556 is coupled to capacitor 560 and resistor 562. Resistor 562 is coupled to the regulated output node 600.

The second side of the current mirror includes PMOS transistors 564, 566 and 568. Node 570 is coupled to the gate of transistor 548 of amplifier 540 (FIG. 6B). The current mirror sides are coupled together with NMOS transistors 572 and 574. Transistors 556 and 568 of the current mirror can be fabricated to have a large threshold voltage, Vth, and a long channel region. The large Vth helps keep the two transistors operating in saturation region. The long channel helps reduce the channel length modulation effect. That is, the effect of the drain-source voltage on the drain-source current, Ids, is reduced.

A differential amplifier circuit 580 is coupled to the current mirror circuit to convert a voltage of node 582 to a digital signal. The differential amplifier of this embodiment helps reduce crossing current during operation. Differential amplifiers 580, 530 and 540 share bias circuit 550 via node 551. In addition, amplifier 580 is coupled to the resistor divider circuit node 527 between resistor 514 and 515 to provide a mid-level voltage. The output of differential amplifier 580 is coupled through inverters 584 and 586 and level shifter 590 to output transistor 592. The gate of transistor 592 is also coupled to node 531 of FIG. 6A to control the hysteresis circuit.

In one embodiment, the voltage generator consumes about 5 uA to 30 uA current over power, voltage and temperature specified operation regions. A reason for this range is due to the change of current through transistors 556 and 568. That is, as the threshold voltages of transistors 556 and 568 change (Vgs doesn't change), the currents through the transistors can change dramatically. In one embodiment, resistors can be added between node 558 and source of transistor 556, and between node 570 and the source of transistor 568 to limit the transistor currents.

A driving ability of the output source transistor 592 can be increased by increasing the size of the output transistor. However, if the transistor is increased too much, an increased hysteresis may be experienced when the load current is small. In one embodiment, different output transistors are used for different memory device operation modes. For example, a first output transistor can be used for the self-refresh/power-down mode when there is little load current. A second output transistor can be used during activate or auto refresh operations when a larger driving current may be needed.

In the above embodiments, the output voltage and hysteresis are adjustability. Since the output voltage is Vref1–Vref2, the output center voltage can be adjusted by changing the resistor stack ratio to provide different Vref1 and Vref2 voltages. The generator hysteresis can also be adjusted by changing the resistor stack bypassed resistor value.

The invention claimed is:

1. A voltage generator circuit comprising:
   a source transistor coupled between a negative voltage source and an output node, wherein the source transistor is selectively activated to couple the output node to the negative voltage source to regulate an output voltage;
   a reference voltage circuit providing first and second reference voltages, where the first reference voltage Vref1 is less than the second reference voltage Vref2; and
   a control circuit coupled to control a gate voltage of the source transistor to maintain the output voltage at approximately Vref1–Vref2.

2. The voltage generator circuit of claim 1 wherein the reference voltage circuit comprises a hysteresis circuit to selectively increase the second reference voltage to Vref3 such that the output voltage is regulated in a range of about Vref1–Vref2 to Vref1–Vref3.

3. The voltage generator circuit of claim 1 wherein the reference voltage circuit comprises a resistor divider circuit comprising a plurality of series coupled resistors, the resistor divider having first and second nodes to provide the first and second reference voltages.

4. The voltage generator circuit of claim 3 wherein the reference voltage circuit comprises a bypass transistor coupled across a resistor located between the first and second nodes of the resistor divider circuit, wherein the bypass transistor is deactivated to change Vref2 to a higher potential voltage Vref3.

5. The voltage generator circuit of claim 1 wherein the negative voltage source is an integrated circuit substrate voltage Vbb.

6. The voltage generator circuit of claim 1 wherein the control circuit comprises:
   a pull-up transistor coupled to activate the source transistor; and
   a pull-down transistor coupled to de-activate the source transistor, wherein the pull-up transistor is activated when the output voltage is above a first voltage level and the pull-down transistor is activated when the output voltage is below a second voltage level.

7. The voltage generator circuit of claim 6 wherein the reference voltage circuit comprises a hysteresis circuit to selectively increase the second reference voltage to Vref3 such that the first voltage level is about Vref1–Vref2 and the second voltage level is about Vref1–Vref3.

8. A voltage generator circuit comprising:
   a source transistor coupled between a negative voltage source and an output node, wherein the source transistor is selectively activated to couple the output node to the negative voltage source to regulate an output voltage;
   a resistor divider circuit comprising a plurality of series coupled resistors, the resistor divider having first and second nodes to provide first and second reference voltages having a voltage differential of Vd; and
   a current mirror circuit coupled to the resistor divider and selectively activates the source transistor to maintain the output voltage at an absolute value approximately equal to an absolute value of Vd.

9. The voltage generator circuit of claim 8 wherein the voltage on the output node is negative.

10. The voltage generator circuit of claim 8 further comprising:
    a bypass transistor coupled across a resistor located between the first and second nodes of the resistor divider circuit, wherein the bypass transistor is activated to short the central resistor when the source transistor is turned off.

11. The voltage generator circuit of claim 8 wherein the current mirror circuit comprises:
    a pull-up transistor coupled to activate the source transistor; and
    a pull-down transistor coupled to de-activate the source transistor, wherein the pull-up transistor is activated when the output voltage is above a first threshold level and the pull-down transistor is activated when the output voltage is below a second threshold level.

12. A memory device comprising:
    an array of memory cells;
    access circuitry for accessing the array of memory cells, wherein the access circuitry includes a word line that is pre-charged to negative word line voltage; and
    a voltage generator circuit for regulating the negative word line voltage, the voltage generator comprising:
    a source transistor coupled between a negative voltage source and an output node, wherein the source transistor is selectively activated to couple the output node to the negative substrate voltage source to regulate the negative word line voltage;
    a reference voltage circuit providing first and second reference voltages, where the first reference voltage Vref1 is less than the second reference voltage Vref2; and
    a control circuit coupled to control a gate voltage of the source transistor to maintain the negative word line voltage at approximately Vref1–Vref2.

13. The memory device of claim 12 wherein the reference voltage circuit selectively increases the second reference voltage to Vref3 such that the negative word line voltage is regulated in a range of about Vref1–Vref2 to Vref1–Vref3.

14. The memory device of claim 12 wherein the reference voltage circuit comprises a resistor divider circuit having a plurality of series coupled resistors, the resistor divider having first and second nodes to provide the first and second reference voltages.

15. The memory device of claim 14 wherein the reference voltage circuit comprises a switch coupled across a resistor located between the first and second nodes of the resistor divider circuit, wherein the bypass transistor is deactivated to change Vref2 to a higher potential voltage Vref3 such that the negative word line voltage is regulated in a range of about Vref1–Vref2 to Vref1–Vref3.

16. A memory device comprising:
    an array of memory cells;
    access circuitry for accessing the array of memory cells, wherein the access circuitry includes a word line that is pre-charged to negative word line voltage; and
    a voltage generator circuit for regulating the negative word line voltage, the voltage generator comprising:
    a source transistor coupled between a negative voltage source and an output node, wherein the source transistor is selectively activated to couple the output node to the negative substrate voltage source to regulate the negative word line voltage;
    a resistor divider circuit having a plurality of series coupled resistors, the resistor divider having first and second nodes to provide a first reference voltage Vref1 and a second reference voltage Vref2, where the first reference voltage Vref1 is less than the second reference voltage Vref2;
    a switch coupled across a central resistor located between the first and second nodes of the resistor divider circuit, wherein the bypass transistor is deactivated to change Vref2 to a higher potential voltage Vref3; and a current mirror circuit coupled to the resistor divider and selectively activates the source transistor to maintain the negative word line voltage in the range of about Vref1–Vref2 to Vref1–Vref3.

17. The memory device of claim 16 wherein the current mirror circuit comprises:
   a pull-up transistor coupled to activate the source transistor; and
   a pull-down transistor coupled to de-activate the source transistor, wherein the pull-up transistor is activated when the negative word line voltage is above Vref1–Vref2 and the pull-down transistor is activated when the negative word line voltage is below Vref1–Vref3.

18. The memory device of claim 17 wherein the current mirror circuit further comprises:
   first current mirror circuit to control a current I1 through the pull-down transistor, wherein I1 is proportional to Vref1 minus the negative word line voltage; and
   second current mirror to control a current I2 through the pull-up transistor, wherein I2 is proportional to Vref2.

19. A method of generating a negative word line voltage comprising:
   providing first, second and third reference voltages, Vref1, Vref2 and Vref3, respectively, wherein Vref3 is greater than Vref2 which is greater than Vref1;
   monitoring a potential voltage of the negative word line voltage; and
   selectively activating a switch coupled between a negative source voltage and a word line voltage node in response to the monitoring, wherein the negative word line voltage is regulated between about Vref1–Vref2 and Vref1–Vref3.

20. The method of claim 19 wherein a resistor divider circuit provides Vref1 and Vref3 when the switch is deactivated, and the divider circuit provides Vref1 and Vref2 when the switch is activated.

21. The method of claim 19 wherein the switch is a source transistor and selectively activating the switch comprises:
   controlling currents through a pull-up transistor and a pull-down transistor each coupled to the source transistor wherein a current through the pull-up transistor is increased when the negative word line voltage drops to Vref1–Vref, and a current through the pull-down transistor is increased when the negative word line voltage increases to about Vref1–Vref2.

22. A method of regulating a negative word line voltage, Vout, in a semiconductor memory device, the method comprising:
   providing first and second reference voltages, Vref1 and Vref2, respectively, with a resistor divider circuit, wherein Vref2 is greater than Vref1; and
   using Vref1, Vref2, and Vout to control currents through a pull-up transistor and a pull-down transistor each coupled to a gate of a source transistor, the source transistor coupled between a negative substrate voltage Vbb and a word line voltage node, wherein the source transistor is selectively activated to regulate Vout at about Vref1–Vref2.

* * * * *

UNITED STATES PATENT AND TRADEMARK OFFICE
CERTIFICATE OF CORRECTION

PATENT NO. : 7,286,417 B2  
APPLICATION NO. : 11/157648  
DATED : October 23, 2007  
INVENTOR(S) : Pan Page 1 of 1

It is certified that error appears in the above-identified patent and that said Letters Patent is hereby corrected as shown below:

In column 10, line 14, in Claim 21, delete "Vref1-Vref," and insert -- Vref1-Vref3, --, therefor.

Signed and Sealed this

Twenty-fifth Day of December, 2007

JON W. DUDAS  
*Director of the United States Patent and Trademark Office*